United States Patent
Im et al.

(10) Patent No.: US 9,614,013 B2
(45) Date of Patent: Apr. 4, 2017

(54) TRANSPARENT ORGANIC LIGHT EMITTING DISPLAY DEVICES INCLUDING SOLAR CELL AND METHODS OF MANUFACTURING THE SAME

(71) Applicant: Samsung Display Co., Ltd., Yongin (KR)

(72) Inventors: Jun-Mo Im, Seoul (KR); Sang-Hyun Jeon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/824,486

(22) Filed: Aug. 12, 2015

(65) Prior Publication Data

US 2016/0118446 A1    Apr. 28, 2016

(30) Foreign Application Priority Data

Oct. 28, 2014   (KR) .................. 10-2014-0147615

(51) Int. Cl.
*H01L 27/32*   (2006.01)
*H01L 27/28*   (2006.01)
*H01L 51/52*   (2006.01)

(52) U.S. Cl.
CPC ........ *H01L 27/3227* (2013.01); *H01L 27/288* (2013.01); *H01L 51/5281* (2013.01)

(58) Field of Classification Search
CPC ........................... H01L 27/3227; H01L 51/56
See application file for complete search history.

(56) References Cited

U.S. PATENT DOCUMENTS

| | | | |
|---|---|---|---|
| 2003/0137325 A1* | 7/2003 | Yamazaki | H01L 27/322 327/80 |
| 2014/0120645 A1* | 5/2014 | Paek | H01L 27/3211 438/35 |
| 2014/0225087 A1* | 8/2014 | Fang | H01L 27/288 257/40 |
| 2014/0225090 A1* | 8/2014 | Lee | H01L 27/288 257/40 |
| 2015/0108508 A1* | 4/2015 | Wu | G02F 1/157 257/84 |

FOREIGN PATENT DOCUMENTS

| | | |
|---|---|---|
| DE | 102008059214 | 2/2012 |
| EP | 2605281 | 6/2013 |
| KR | 1020050035595 | 4/2005 |
| KR | 1020110014326 | 2/2011 |
| KR | 1020110064410 | 6/2011 |

* cited by examiner

*Primary Examiner* — Mamadou Diallo
(74) *Attorney, Agent, or Firm* — H.C. Park & Associates, PLC

(57) ABSTRACT

A transparent organic light-emitting display device may include a lower transparent substrate having a pixel region and a boundary region disposed between adjacent pixel regions, a solar cell disposed on the lower transparent substrate, a display structure disposed on the solar cell, and an overcoat layer disposed between the solar cell and the display structure, in which the overcoat layer electrically insulates the display structure from the solar cell.

17 Claims, 8 Drawing Sheets

TRANSPARENT ORGANIC LIGHT EMITTING DISPLAY DEVICES INCLUDING SOLAR CELL AND METHODS OF MANUFACTURING THE SAME

CROSS-REFERENCE TO RELATED APPLICATION

This application claims priority from and the benefit of Korean patent Application No. 10-2014-0147615, filed on Oct. 28, 2014, which is hereby incorporated by reference for all purposes as if fully set forth herein.

BACKGROUND

Field

Exemplary embodiments of the present invention relate to transparent organic light-emitting display devices and method of manufacturing transparent organic light-emitting display devices. More particularly, exemplary embodiments of the present invention relate to transparent organic light-emitting display devices including solar cells therein, and method of manufacturing transparent organic light-emitting display devices including solar cells.

Discussion of the Background

A transparent organic light-emitting display device may be one of the next-generation display devices. In the transparent organic light-emitting display device, an image of an object before or after a transparent region of the transparent organic light-emitting display device may be recognized when the transparent organic light-emitting display device is in an ON state. In an OFF state of the transparent organic light-emitting display device, an image may be displayed in the pixel region of the transparent organic light-emitting display device. Conventional transparent organic light-emitting display devices may operate by using an external power source such as a battery. The external power source may require periodic charge and have limited storage capacity. Some of disadvantages of the conventional transparent organic light-emitting display device may also include, for example, limited portability, relatively great thickness, and relatively heavy weight.

A solar cell may be attached to a rear side of the conventional transparent organic light-emitting display device, however, the conventional transparent organic light-emitting display device may still have relatively great thickness, relatively heavy weight, and be susceptible to damage in the process of attaching the solar cell to the transparent organic light-emitting display device, without improving the portability of the display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments of the present invention provide transparent organic light-emitting display devices including solar cells that may improve characteristics of the display devices, such as enhanced portability, improved emission duration, reduced thickness, and light weight.

Exemplary embodiments of the present invention also provide methods of manufacturing the transparent organic light-emitting display devices including the solar cells therein.

Additional aspects will be set forth in the detailed description which follows, and, in part, will be apparent from the disclosure, or may be learned by practice of the inventive concept.

According to exemplary embodiments of the present invention, a transparent organic light-emitting display device includes a lower transparent substrate having a pixel region and a boundary region disposed between adjacent pixel regions, a solar cell disposed on the lower transparent substrate, a display structure disposed on the solar cell, and an overcoat layer disposed between the solar cell and the display structure, in which the overcoat layer electrically insulates the display structure from the solar cell.

The overcoat layer may include silicon nitride (SiNx) containing hydrogen (H) having a curing temperature below 100° C.

A surface roughness of the overcoat layer may vary according to the hydrogen content.

The solar cell may be disposed in both the pixel region and the boundary region.

The solar cell may be disposed in the boundary region only.

The transparent organic light-emitting display device may further include an insulation layer pattern electrically insulating adjacent solar cells, in which the insulation layer pattern may entirely overlap the display structure in the pixel region.

The solar cell may be disposed at a portion of the pixel region and at a portion of the boundary region.

The transparent organic light-emitting display device may further include an insulation layer pattern electrically insulating adjacent solar cells, in which the insulation layer pattern may partially overlap the display structure in the pixel region.

The solar cell may be configured to convert at least one of incident light from outside the transparent organic light-emitting display device and light emitted from the display structure, into electric energy.

The electric energy generated by the solar cell may be configured to be used as a power source for the display structure of the transparent organic light-emitting display device.

The solar cell may include a lower electrode, a first semiconductor pattern disposed on the lower electrode, the first semiconductor pattern including an n-type semiconductor, a second semiconductor pattern disposed on the first semiconductor pattern, the second semiconductor pattern including a p-type semiconductor, an upper electrode disposed on the second semiconductor pattern, and an anti-reflective layer disposed on the upper electrode, the anti-reflective layer including a transparent conductive material.

The transparent organic light-emitting display device may further include an encapsulation layer enclosing the display device, an additional overcoat layer disposed on the encapsulation layer, touch patterns disposed on the additional overcoat layer, a polarization member disposed on the touch patterns, and an upper transparent substrate disposed on the polarization member.

According to an exemplary embodiment of the present invention, a transparent organic light-emitting display device may include a lower transparent substrate having a pixel region and a boundary region disposed between adjacent pixel regions, a display structure disposed on the lower transparent substrate, a solar cell disposed on the display structure, and an overcoat layer disposed between the display structure and the solar cell, in which the overcoat layer electrically insulates the solar cell from the display structure.

According to exemplary embodiments of the present invention, a method of manufacturing a transparent organic light-emitting display device may include providing a lower transparent substrate having a pixel region and a boundary region disposed between adjacent pixel regions, disposing a solar cell on the lower transparent substrate, disposing a display structure on the solar cell, and disposing an overcoat layer between the solar cell and the display structure, in which the overcoat layer electrically insulates the display structure from the solar cell.

Disposing the overcoat layer may include depositing a silicon nitride including hydrogen by a low temperature chemical vapor deposition process, in which the hydrogen content in the overcoat layer may vary according to a ratio between silane ($SiH_4$) and ammonia ($NH_3$).

Disposing the solar cell may include disposing the solar cell in both the pixel region and the boundary region.

Disposing the solar cell may include disposing the solar cell on the boundary region, in which the insulation layer pattern may entirely overlap the display structure in the pixel region, and the insulation layer pattern electrically insulates adjacent solar cells.

Disposing the solar cell may include disposing the solar cell at a portion of the pixel region and at a portion of the boundary region, disposing an insulation layer pattern to partially overlap the display structure in the pixel region, in which the insulation layer pattern electrically insulates adjacent solar cells.

The method of manufacturing the transparent organic light-emitting display device may further include disposing an encapsulation layer to enclose the display structure, disposing an additional overcoat layer on the encapsulation layer, disposing touch patterns on the additional overcoat layer, disposing a polarization member on the touch patterns, and disposing an upper transparent substrate on the polarization member.

According to an exemplary embodiment of the present invention, a method of manufacturing a transparent organic light-emitting display device may include providing a lower transparent substrate having a pixel region and a boundary region disposed between adjacent pixel regions, disposing a display structure on the lower transparent substrate, disposing a solar cell on the display structure, and disposing an overcoat layer between the display structure and the solar cell, in which the overcoat layer electrically insulates the solar cell from the display structure.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
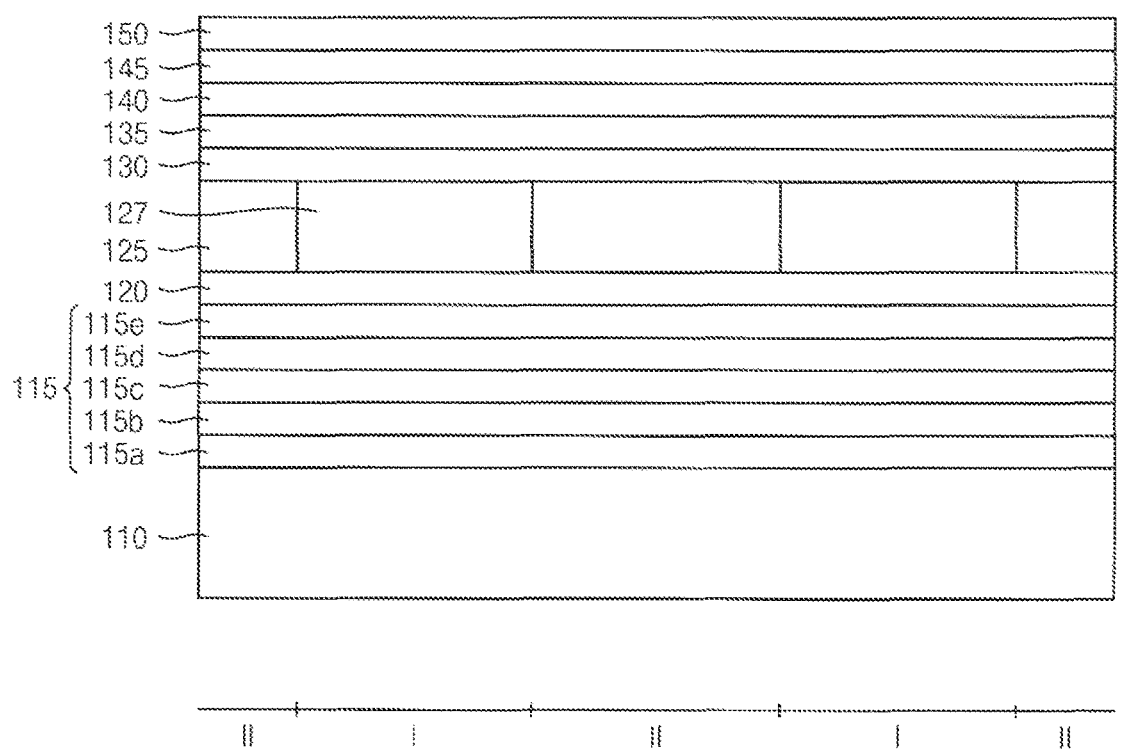
FIG. 1 is a cross-sectional view illustrating a transparent organic light-emitting display device according to an exemplary embodiment of the present invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a cross-sectional view illustrating a transparent organic light-emitting display device according to an exemplary embodiment of the present invention.

Referring to FIG. 1, a transparent organic light-emitting display device 100 may include a lower transparent substrate 110, a solar cell 115, an overcoat layer 120, a display structure 125, an encapsulation layer 130, touch patterns 140, a polarization member 145, and an upper transparent substrate 150.

The lower transparent substrate 110 may have pixel regions I and boundary regions II disposed between the pixel regions I. The pixel region I may include an organic light-emitting structure 127 of the display structure 125 and the boundary region II may include other elements of the transparent organic light-emitting display device 100, such as semiconductor devices (not illustrated), wiring (not illustrated), insulation layers (not illustrated), and conductive patterns (not illustrated). According to an exemplary embodiment of the present invention, the lower transparent substrate 110 may be a rear cover of the transparent organic light-emitting display device 100. The lower transparent substrate 110 may include a transparent insulation material, such as polyimide-based resin that may provide a relatively high mechanical strength with transparent characteristics to the lower transparent substrate 110.

The solar cell 115 may be disposed on the lower transparent substrate 110. The solar cell 115 may convert incident light from outside the transparent organic light-emitting display device 100 and/or light emitted from the display structure 125 into electric energy. Accordingly, the solar cell 115 may be a subsidiary power source of the transparent organic light-emitting display device 100. The solar cell 115 may include a crystalline silicon solar cell, a fuel induction type solar cell, and an organic material-base solar cell. The photovoltaic energy conversion efficiency of the solar cell 115 may be improved when the solar cell 115 has a multi-layered structure.

The solar cell 115 may be provided in both of the pixel region I and the boundary region II of the lower transparent substrate 110. As illustrated in FIG. 1, the solar cell 115 may include a lower electrode 115a, a first semiconductor pattern 115b, a second semiconductor pattern 115c, an upper electrode 115d, and an anti-reflective layer 115e. Incident light from outside may be relatively easily transmitted through the lower electrode 115a and/or the upper electrode 115d when each of the lower electrode 115a and/or the upper electrode 115d includes a transparent conductive material in accordance with the display type of the transparent organic light-emitting display device 100.

A p-n junction region may be generated between the first semiconductor pattern 115b that may include a p-type semiconductor and the second semiconductor pattern 115c that may include a n-type semiconductor. Thus, incident light from outside and/or light emitted from the display structure 125 may be converted into electric energy at the p-n junction region. The converted electric energy may be used as the subsidiary power source of the transparent organic light-emitting display device 100. The anti-reflective layer 115e may prevent incident light from being reflected by the solar cell 115, and accordingly, the transparent organic light-emitting display device 100 may provide superior quality images.

The electric energy generated from the solar cell 115 may be stored in an external power source (e.g., a battery) of the transparent organic light-emitting display device 100. The external power source may be continuously recharged by the electric energy generated from the solar cell 115, and thus the duration of the transparent organic light-emitting display device 100 may increase while reducing the time required to recharge the external power source.

The overcoat layer 120 may be disposed on the lower transparent substrate 110 to substantially cover the solar cell 115. The overcoat layer 120 may electrically insulate the display structure 125 from the solar cell 115. Thus, the overcoat layer 120 may have a predetermined thickness for blocking an electrical interference between the solar cell 115 and the display structure 125. The overcoat layer 120 may include a silicon-based insulation material or a transparent organic material to prevent the overcoat layer 120 from substantially reducing the transmittance of the transparent organic light-emitting display device 100. Further, the overcoat layer 120 may have a curing temperature below 100° C. to prevent the elements of the transparent organic light-emitting display device 100 from being deteriorated while forming the overcoat layer 120 on the lower transparent substrate 110. The display structure 125 may be formed at a relatively low temperature due to the low curing temperature characteristics of the overcoat layer 120, and thus thermal damages to the display structure 125 and the lower transparent substrate 110 may be prevented or reduced. As a result, the transparent organic light-emitting display device 100 according to the present exemplary embodiment may enhance transmittance and improve reliability.

According to exemplary embodiments of the present invention, the overcoat layer 120 may include silicon nitride (SiNx) containing hydrogen (H). A surface roughness of the overcoat layer 120 may vary according to the hydrogen content in the overcoat layer 120. For example, as the hydrogen content in the overcoat layer 120 increases, the overcoat layer 120 may have improved surface roughness. The hydrogen content may be controlled without decreasing insulation characteristics of the overcoat layer 120. As the surface roughness of the overcoat layer 120 is improved, an amount of total light that passes through the overcoat layer 120 and reaching the solar cell 115 may be increased. More particularly, the total light passing through the overcoat layer 120 may include incident light from outside and light generated from the organic light-emitting structure 127.

The display structure 125 may be directly disposed on the overcoat layer 120. The display structure 125 may include the organic light-emitting structure 127 in the pixel region I and other elements (e.g., the semiconductor devices, the wirings, the insulation layers, the conductive patterns, etc.) in the boundary region II. The organic light-emitting structure 127 may include a first electrode (not illustrated), an organic light-emitting layer (not illustrated), and a second electrode (not illustrated). The display structure 125 may have a relatively high transmittance, so that the amount of light emitted from the organic light-emitting structure 127 and reaching the solar cell 115 may not be substantially reduced by the display structure 125. Further, the display structure 125 may be directly disposed on the overcoat layer 120 to reduce dimensions (e.g., a thickness, a weight, etc.) of the transparent organic light-emitting display device 100.

The encapsulation layer 130 may be disposed on the display structure 125 to enclose the display structure 125. The encapsulation layer 130 may include a transparent organic material or a silicon-based insulation material, and have a relatively thin-film shape.

An additional overcoat layer 135 may be disposed on the encapsulation layer 130. The additional overcoat layer 135 may include substantially similar material as the overcoat layer 120. Since the encapsulation layer 130 may have the thin-film shape, the encapsulation layer 130 may not sufficiently support the overlying elements of the transparent organic light-emitting display device 100, such as the touch patterns 140, the polarization member 145, and the upper transparent substrate 150. The additional overcoat layer 135 may effectively support the overlying elements, such as the touch patterns 140, the polarization member 145, and the upper transparent substrate 150. Accordingly, the transparent organic light-emitting display device 100 may have an on-cell configuration to provide thinner thickness and lighter weight.

The touch patterns 140 may be disposed on the additional overcoat layer 135. Each of the touch patterns 140 may include a transparent conductive material. The touch patterns 140 may have various shapes, such as a square shape, and a rhombus shape.

The polarization member 145 may be disposed on the touch patterns 140. The polarization member 145 may selectively transmit incident light from outside to reduce the reflection of the incident light. The polarization member 145 may include an iodine-based polarization film, a dye-based polarization film, and a polyene-based polarization film.

The upper transparent substrate 150 may be disposed on the polarization member 145. The upper transparent substrate 150 may be arranged opposite to the lower transparent substrate 110. The upper transparent substrate 150 may include substantially similar material as the lower transparent substrate 110.

The conventional transparent organic light-emitting display device may operate using an external power source that requires periodic charging. Accordingly, the conventional transparent organic light-emitting display device may have some limits from the external power source. Further, because the dimension and configuration of the external power source may be limited, the conventional transparent organic light-emitting display device may not have desired portability. A solar cell may be attached to a rear side of a transparent organic light-emitting display device as a subsidiary power source, however, the attached solar cell may increase the thickness and weight of the transparent organic light-emitting display device and may damage the transparent organic light-emitting display device while attaching the solar cell. According to exemplary embodiments of the present invention, the transparent organic light-emitting display device 100 may include the solar cell 115 as a subsidiary power source that provides electric energy to the transparent organic light-emitting display device 100 for continuous operation, even when the external power source is not charged periodically. Thus, the transparent organic light-emitting display device 100 may enhance portability and improve duration, as the solar cell 115 may generate electric energy using incident light from outside and/or light emitted from the organic light-emitting structure 127. Moreover, the thickness and weight of the transparent organic light-emitting display device 100 may be reduced as the solar cell 115 may be included in the transparent organic light-emitting display device 100.

Figure 2:
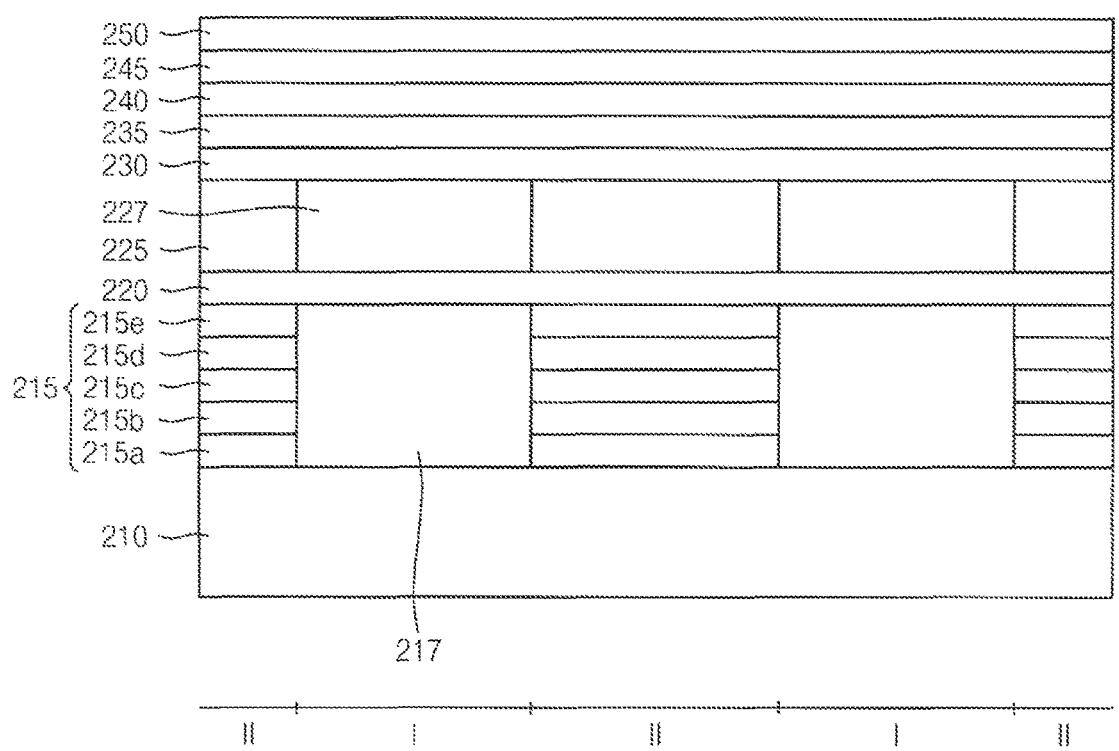
FIG. 2 is a cross-sectional view illustrating a transparent organic light-emitting display device according to an exemplary embodiment of the present invention.

FIG. 2 is a cross-sectional view illustrating a transparent organic light-emitting display device according to an exemplary embodiment of the present invention. The transparent organic light-emitting display device 200 may include elements substantially similar to the transparent organic light-emitting display device 100 illustrated with respect to FIG. 1, and repeated description of the substantially similar elements and operations will be omitted.

Referring to FIG. 2, the transparent organic light-emitting display device 200 may include a lower transparent substrate 210, a solar cell 215, an overcoat layer 220, a display structure 225, an encapsulation layer 230, touch patterns 240, a polarization member 245, and an upper transparent substrate 250. The solar cell 215 may include a lower electrode 215a, a first semiconductor pattern 215b, a second semiconductor pattern 215c, an upper electrode 215d, and an anti-reflective layer 215e.

The solar cell 215 may be disposed on boundary regions II of the lower transparent substrate 210. An insulation layer pattern 217 that electrically insulates adjacent solar cells 215 may be disposed on pixel regions I of the lower transparent substrate 210. The insulation layer pattern 217 may include a transparent insulation material. The insulation layer pattern 217 may entirely overlap an organic light-emitting structure 227 of the display structure 225 in the pixel regions. The solar cell 215 may not be disposed at a portion of the pixel region I, where absorption rate of incident light from outside may be low, to reduce manufacturing cost and time of the transparent organic light-emitting display device 200. The insulation layer pattern 217 may transmit light generated from the organic light-emitting structure 227, thereby improving light efficiency of the transparent organic light-emitting display device 200.

Figure 3:
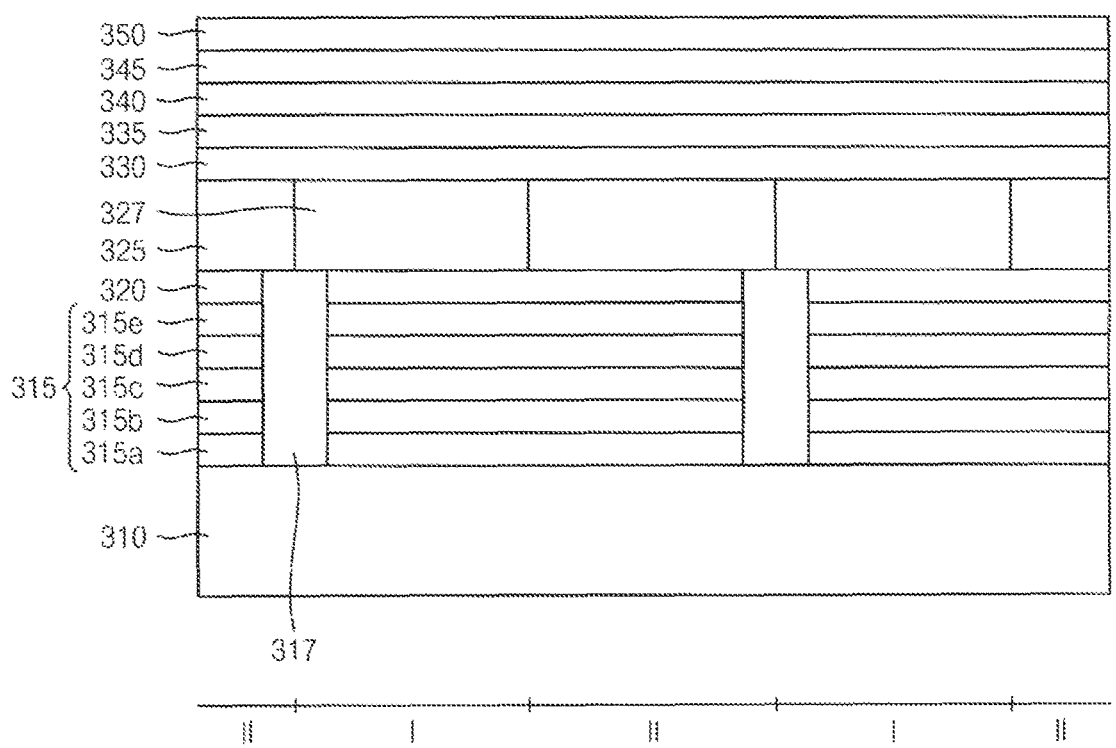
FIG. 3 is a cross-sectional view illustrating a transparent organic light-emitting display device according to an exemplary embodiment of the present invention.

FIG. 3 is a cross-sectional view illustrating a transparent organic light-emitting display device 300 according to an exemplary embodiment of the present invention. The transparent organic light-emitting display device 300 may include elements substantially similar to the transparent organic light-emitting display device 100 illustrated with respect to FIG. 1, and repeated description of the substantially similar elements and operations will be omitted.

Referring to FIG. 3, the transparent organic light-emitting display device 300 may include a lower transparent substrate 310, a solar cell 315, an overcoat layer 320, a display structure 325, an encapsulation layer 330, touch patterns 340, a polarization member 345, and an upper transparent substrate 350. The solar cell 315 may include a lower electrode 315*a*, a first semiconductor pattern 315*b*, a second semiconductor pattern 315*c*, an upper electrode 315*d*, and an anti-reflective layer 315*e*.

The solar cell 315 may be disposed at a portion of a pixel region I and at a portion of a boundary region II of the lower transparent substrate 310. An insulation layer pattern 317 may be disposed in the pixel region I of the lower transparent substrate 310 to electrically insulate adjacent solar cells 315 in the pixel regions I. The insulation layer pattern 317 may extend to a portion of the pixel region I and partially overlap an organic light-emitting structure 327 of the display structure 325. The insulation layer pattern 317 may include a transparent insulation material. Light generated from the organic light-emitting structure 327 may reach the solar cell 315 through the insulation layer pattern 317 that partially overlaps the display structure 325.

Figure 4:
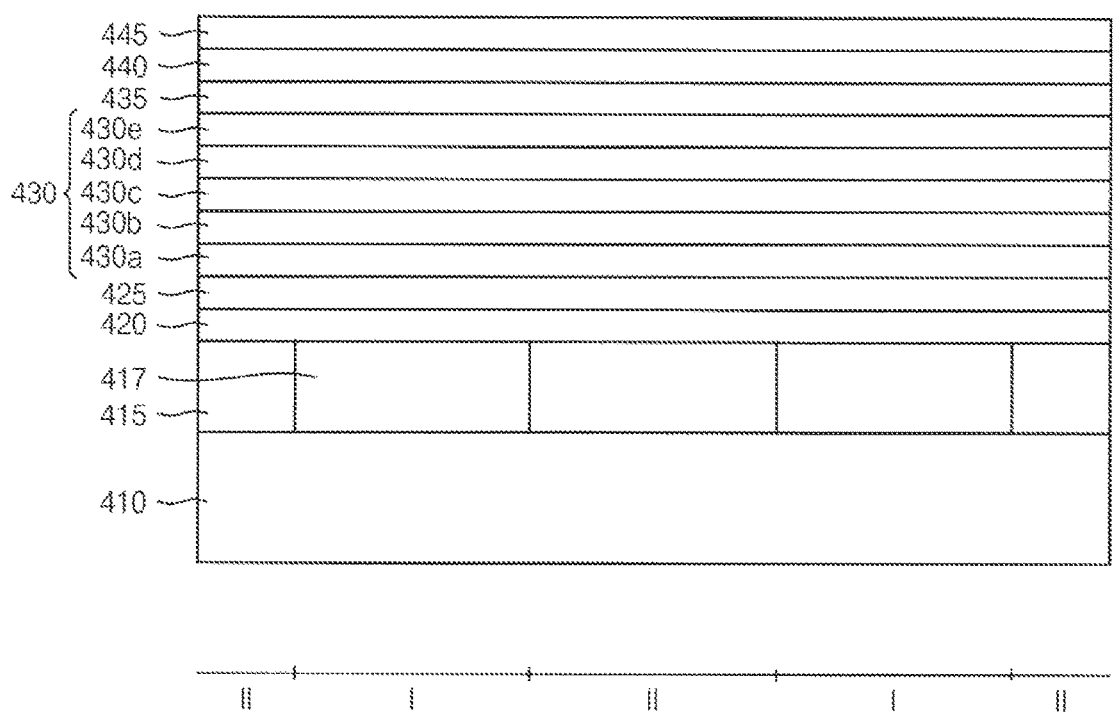
FIG. 4 is a cross-sectional view illustrating a transparent organic light-emitting display device according to an exemplary embodiment of the present invention.

FIG. 4 is a cross-sectional view illustrating a transparent organic light-emitting display device 400 according to an exemplary embodiment of the present invention. The transparent organic light-emitting display device 400 may include elements substantially similar to the transparent organic light-emitting display device 100 illustrated with respect to FIG. 1, and repeated description of the substantially similar elements and operations will be omitted.

Referring to FIG. 4, the transparent organic light-emitting display device 400 may include a lower transparent substrate 410, a display structure 415, an encapsulation layer 420, an overcoat layer 425, a solar cell 430, touch patterns 435, a polarization member 440, and an upper transparent substrate 445.

The lower transparent substrate 410 may include pixel regions I and boundary regions II between adjacent pixel regions I. The lower transparent substrate 410 may include a transparent insulation material and serve as a rear cover of the organic light-emitting display device 400.

The display structure 415 including an organic light-emitting structure 417 may be disposed on the lower transparent substrate 410. The display structure 415 may include the organic light-emitting structure 417 in the pixel region I and other elements (e.g., the semiconductor devices, the wirings, the insulation layers, the conductive patterns, etc.) in the boundary region II. The encapsulation layer 420 may be disposed on the display structure 415. The encapsulation layer 420 may include a film containing a transparent organic material or a silicon-based insulation material. The encapsulation layer 420 may have a relatively thin thickness for enclosing the display structure 415.

The overcoat layer 425 may be disposed on the encapsulation layer 420. The overcoat layer 425 may support the overlying structures, such as the solar cell 430, the touch patterns 435, the polarization member 440, and the upper transparent substrate 445. The overcoat layer 425 may electrically insulate the display structure 415 from the solar cell 430. The overcoat layer 425 may include a transparent insulation material having a relatively low curing temperature to prevent thermal damages to the organic light-emitting display device 400 when forming the overcoat layer 425 and/or the solar cell 430 on the overcoat layer 425. Therefore, the transparent organic light-emitting display device 400 may have enhanced reliability.

The solar cell 430 may be disposed on the overcoat layer 425. The solar cell 430 may include a lower electrode 430*a*, a first semiconductor pattern 430*b*, a second semiconductor pattern 430*c*, an upper electrode 430*d*, and an anti-reflective layer 430*e*. When the solar cell 430 is arranged over the display structure 415, an amount of incident light from outside that reaches the solar cell 430 may be increased. Additionally, the solar cell 430 may absorb more light emitted from the organic light-emitting structure 417, so that the solar cell 430 may generate more electric energy than the solar cell disposed on the lower transparent substrate. More particularly, the solar cell 430 may convert greater amount of incident light from outside into the electric energy. Therefore, the solar cell 430 may be a more effective subsidiary power source of the transparent organic light-emitting display device 400.

The touch patterns 435 may be disposed on the solar cell 430. Each of the touch patterns 435 may include a transparent conductive material. In this case, the touch patterns 435 may be directly disposed on the solar cell 430 (i.e., the anti-reflective layer 430*e* of the solar cell 430) to provide an on-cell configuration of the transparent organic light-emitting display device 400. Thus, the transparent organic light-emitting display device 400 may have reduced thickness.

The polarization member 440 may be disposed on the touch patterns 435 to prevent the reflection of incident light from outside. The polarization member 440 may include an iodine-based polarization film, a dye-based polarization film, and a polyene-based polarization film.

The upper transparent substrate 445 may be disposed on the polarization member 440. The upper transparent substrate 445 may include substantially similar material as the lower transparent substrate 410.

Figure 5:
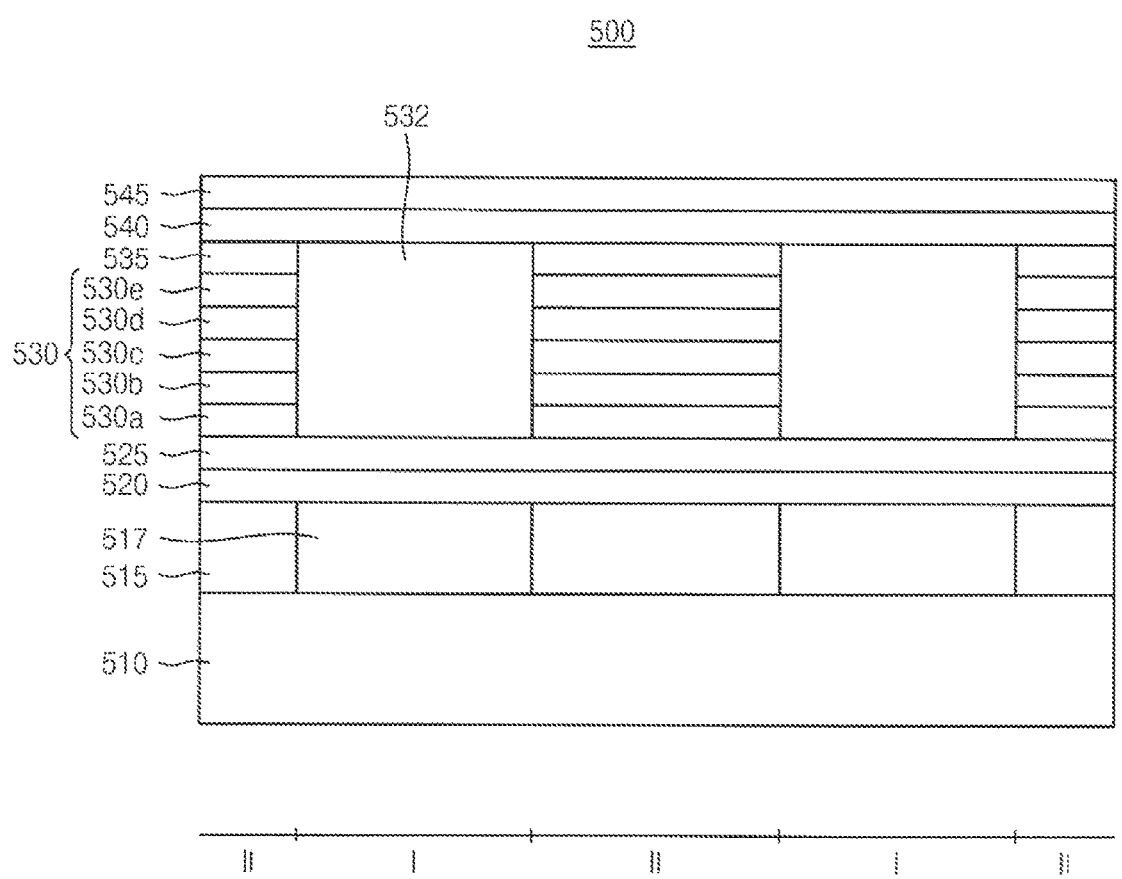
FIG. 5 is a cross-sectional view illustrating a transparent organic light-emitting display device according to an exemplary embodiment of the present invention.

FIG. 5 is a cross-sectional view illustrating a transparent organic light-emitting display device according to an exemplary embodiment of the present invention. The transparent organic light-emitting display device 500 may include elements substantially similar to the transparent organic light-emitting display device 400 illustrated with respect to FIG. 4, and repeated description of the substantially similar elements and operations will be omitted.

Referring to FIG. 5, the transparent organic light-emitting display device 500 may include a lower transparent substrate 510, a display structure 515, an encapsulation layer 520, an overcoat layer 525, a solar cell 530, touch patterns 535, a polarization member 540, and an upper transparent substrate 545. The solar cell 530 may include a lower electrode 530*a*, a first semiconductor pattern 530*b*, a second semiconductor pattern 530*c*, an upper electrode 530*d*, and an anti-reflective layer 530*e*.

The solar cell 530 may be disposed in a boundary region II of the lower transparent substrate 510. An insulation layer pattern 532 may be provided in a pixel region I of the lower transparent substrate 510 to electrically insulate adjacent solar cells 530. The insulation layer pattern 532 may entirely overlap the display structure 515 (i.e., an organic light-emitting structure 517 of the display structure 515). The solar cell 530 may not be disposed directly over the organic light-emitting structure 517 to reduce manufacturing cost and time of the transparent organic light-emitting display device 500. The insulation layer pattern 532 may transmit light emitted from the organic light-emitting structure 517 to improve the light efficiency of the transparent organic light-emitting display device 500.

Figure 6:
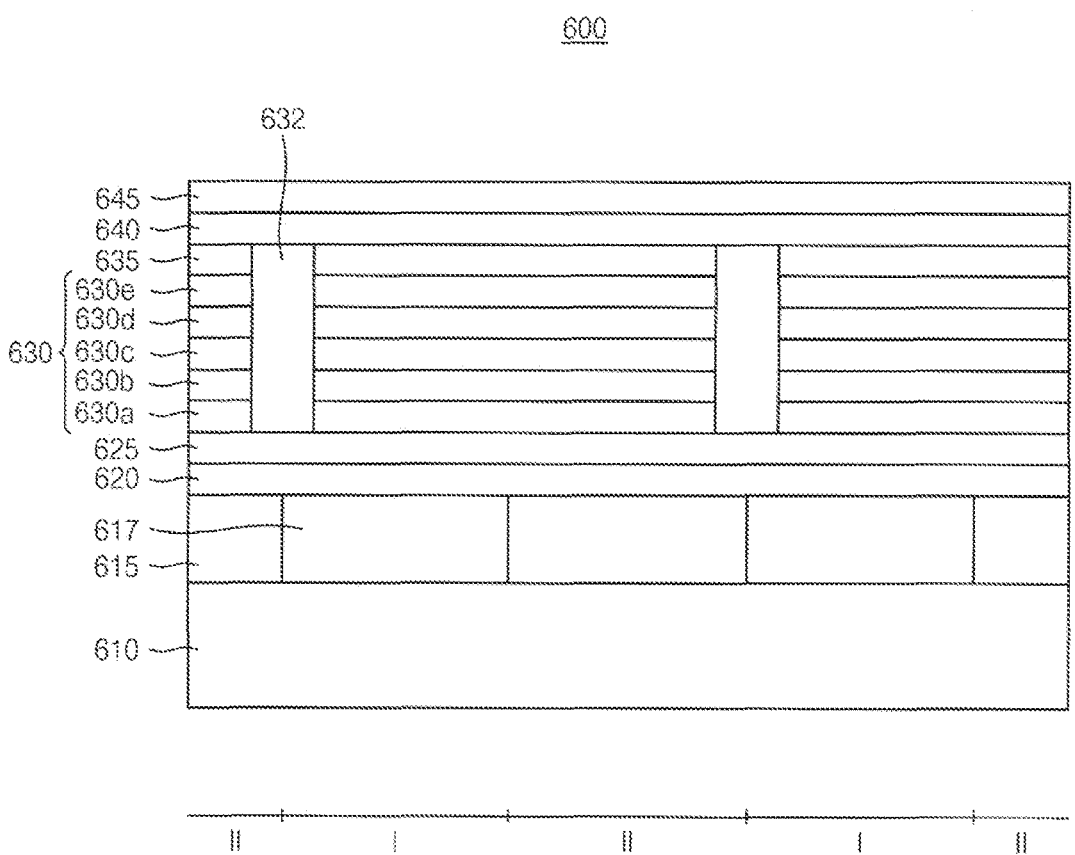
FIG. 6 is a cross-sectional view illustrating a transparent organic light-emitting display device according to an exemplary embodiment of the present invention.

FIG. 6 is a cross-sectional view illustrating a transparent organic light-emitting display device according to an exemplary embodiment of the present invention. The transparent organic light-emitting display device 600 may include elements substantially similar to the transparent organic light-emitting display device 400 illustrated with respect to FIG. 4, and repeated description of the substantially similar elements and operations will be omitted.

Referring to FIG. 6, the transparent organic light-emitting display device 600 may include a lower transparent substrate 610, a display structure 615, an encapsulation layer 620, an overcoat layer 625, a solar cell 630, touch patterns 635, a polarization member 640, and an upper transparent substrate 645. The solar cell 630 may include a lower electrode 630a, a first semiconductor pattern 630b, a second semiconductor pattern 630c, an upper electrode 630d, and an anti-reflective layer 630e.

The solar cell 630 may be disposed at a portion of a pixel region I and at a portion of a boundary region II of the lower transparent substrate 610. An insulation layer pattern 632 including a transparent insulation material may be arranged in the pixel region I of the lower transparent substrate 610 to electrically insulate adjacent solar cells 630. The insulation layer pattern 632 may extend to the boundary region II, to partially overlap an organic light-emitting structure 617 of the display structure 615. The insulation layer pattern 632 arranged over the organic light-emitting structure 617 may improve light efficiency of the transparent organic light-emitting display device 600.

FIGS. 7 to 10 are cross-sectional views illustrating a method of manufacturing a transparent organic light-emitting display device according to an exemplary embodiment of the present invention. The transparent organic light-emitting display device illustrated in FIG. 7, FIG. 8, FIG. 9, and FIG. 10 may have a configuration substantially similar to the transparent organic light-emitting display device 100 illustrated with respect to FIG. 1, however, any one of the transparent organic light-emitting display devices 200, 300, 400, 500 and 600 illustrated with respect to FIG. 2, FIG. 3, FIG. 4, FIG. 5 and FIG. 6 may be manufactured by modifying the process illustrated in the present exemplary embodiment.

Figure 7:
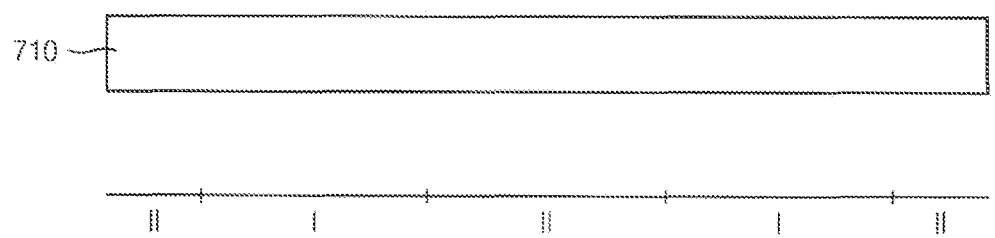
FIG. 7, FIG. 8, FIG. 9, and FIG. 10 are cross-sectional views illustrating a method of manufacturing a transparent organic light-emitting display device according to an exemplary embodiment of the present invention.

Referring to FIG. 7, a lower transparent substrate 710 having pixel regions I and boundary regions II between adjacent pixel regions I is provided. The lower transparent substrate 710 may include a transparent insulation material.

Figure 8:
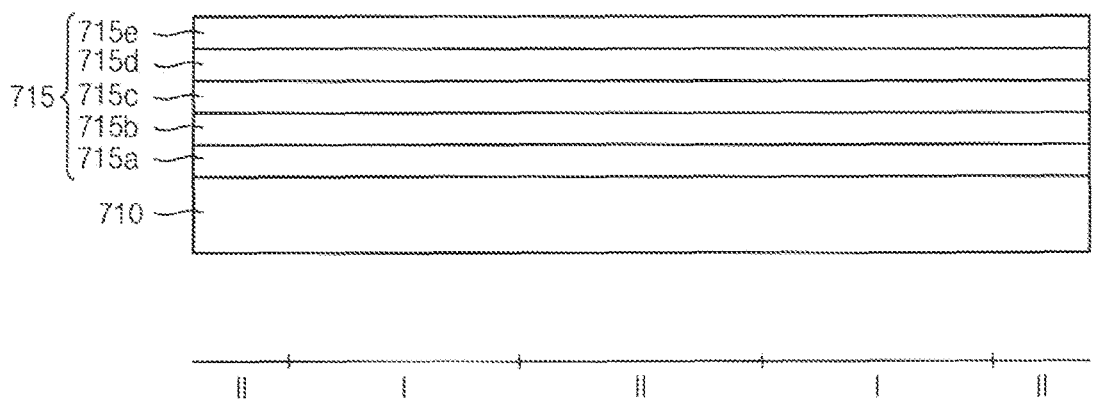

Referring to FIG. 8, a solar cell 715 may be disposed on the lower transparent substrate 710. The solar cell 715 may include a lower electrode 715a, a first semiconductor pattern 715b, a second semiconductor pattern 715c, an upper electrode 715d, and an anti-reflective layer 715e disposed on the lower transparent substrate 710. According to the present exemplary embodiment, the solar cell 715 may be arranged in both of the pixel region I and the boundary region II of the lower transparent substrate 710. According to an exemplary embodiment of the present invention, the solar cell 715 may be formed in the boundary region II only and an insulation layer pattern (not illustrated) may be arranged between adjacent solar cells 715 which entirely overlaps a display structure 725 (see FIG. 10) formed over the insulation layer pattern. According to an exemplary embodiment of the present invention, the solar cell 715 may be formed at a portion of the pixel region I and at a portion of the boundary region II and an insulation layer pattern (not illustrated) may be arranged between adjacent solar cells 715 to electrically insulate the adjacent solar cells 715 and partially overlap the display structure 725 arranged in the pixel region I.

Figure 9:
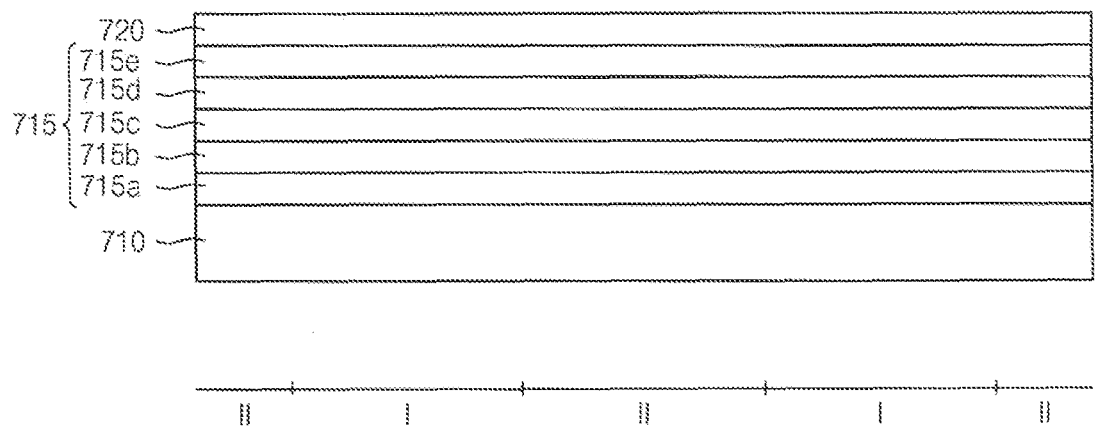

Referring to FIG. 9, an overcoat layer 720 may be disposed on the solar cell 715. The overcoat layer 720 may include a transparent insulation material and/or a silicon-based insulation material. The overcoat layer 720 may have a relatively low curing temperature to prevent the underlying structures from being damaged during forming the overcoat layer 720 and/or forming the display structure 725.

The overcoat layer 720 may be formed by a low temperature chemical vapor deposition (LPCVD) process. When the overcoat layer 720 includes silicon nitride (SiNx), a reaction gas including silane ($SiH_4$) and ammonia ($NH_3$) may be used in the LPCVD process. Controlling a ratio between silane ($SiH_4$) and ammonia ($NH_3$) may vary the hydrogen content of the overcoat layer 720. A surface roughness of the overcoat layer 720 may improve as the hydrogen content increases. However, the hydrogen content in the overcoat layer 720 may be adjusted so that the electrical characteristics of the overcoat layer 720 may not be deteriorated.

Figure 10:
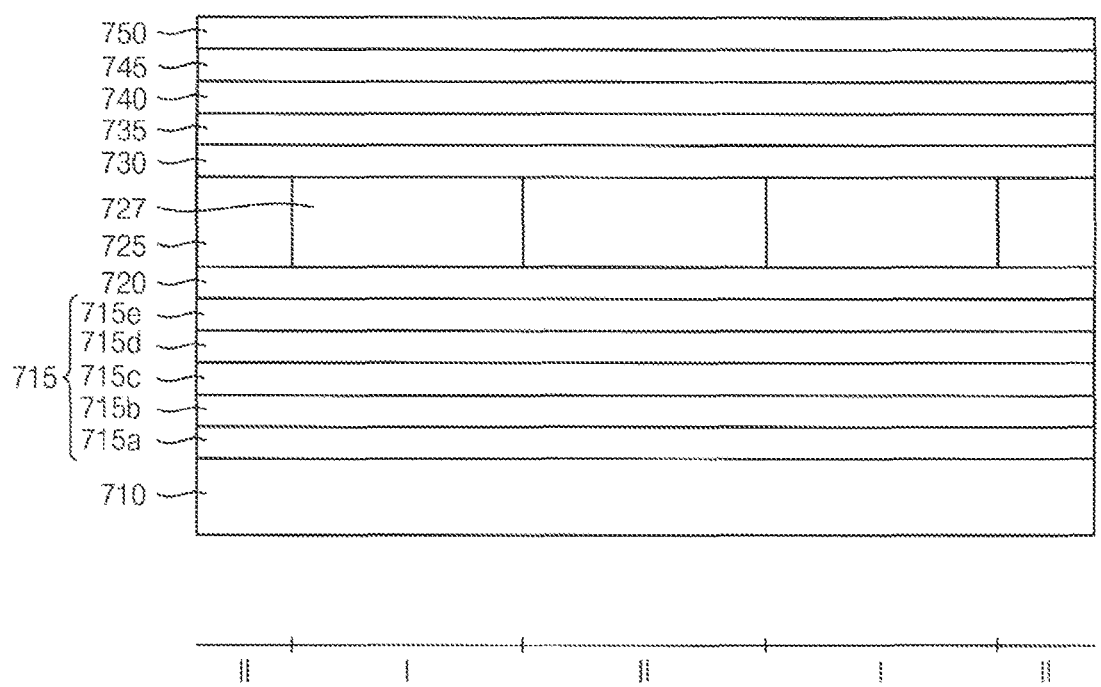

Referring to FIG. 10, the display structure 725 including an organic light-emitting structure 727 may be directly disposed on the overcoat layer 720. The display structure 725 may be obtained at a relatively low temperature in the presence of the overcoat layer 720. Accordingly, the solar cell 715 may not be deteriorated in forming the display structure 725.

After an encapsulation layer 730 is formed on the display structure 725, an additional overcoat layer 735, touch patterns 740, a polarization member 745, and an upper transparent substrate 750 may be sequentially disposed on the encapsulation layer 730 to provide the transparent organic light-emitting display device.

According to exemplary embodiments of the present invention, the transparent organic light-emitting display device may include the solar cell therein, and thus the transparent organic light-emitting display device may continuously operate with the electric energy provided by the solar cell which serves as a subsidiary power source, even though the external power source may not be charged. Accordingly, the transparent organic light-emitting display device may enhance portability and improve duration, since the solar cell may generate the electric energy using incident light from outside and/or light emitted from the organic light-emitting structure. Furthermore, the transparent organic light-emitting display device may have considerably reduced thickness and weight because the solar cell may be included in the transparent organic light-emitting display device.

The transparent organic light-emitting display device according to exemplary embodiments of the present invention may be applied to various display apparatuses for automobiles, vessels, aircrafts, medical machines, telecommunication equipment, etc. The display apparatuses according to exemplary embodiments of the present invention may increase duration, improve reliability, and provide light weight and reduced thickness to the display apparatuses.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A transparent organic light-emitting display device, comprising:
    a lower transparent substrate comprising a pixel region and a boundary region disposed between adjacent pixel regions;
    a solar cell disposed on the lower transparent substrate, the solar cell comprising:
        a lower electrode;
        a first semiconductor pattern disposed on the lower electrode, the first semiconductor pattern comprising an n-type semiconductor;
        a second semiconductor pattern disposed on the first semiconductor pattern, the second semiconductor pattern comprising a p-type semiconductor;
        an upper electrode disposed on the second semiconductor pattern; and
        an anti-reflective layer disposed on the upper electrode, the anti-reflective layer comprising a transparent conductive material;
    a display structure disposed on the lower transparent substrate; and
    an overcoat layer disposed between the solar cell and the display structure,
    wherein the overcoat layer electrically insulates the display structure from the solar cell.

2. The transparent organic light-emitting display device of claim 1, wherein the overcoat layer comprises silicon nitride (SiNx) containing hydrogen (H) having a curing temperature below 100° C.

3. The transparent organic light-emitting display device of claim 2, wherein a surface roughness of the overcoat layer varies according to the hydrogen content.

4. The transparent organic light-emitting display device of claim 3, wherein the solar cell is disposed in both the pixel region and the boundary region.

5. The transparent organic light-emitting display device of claim 3, wherein the solar cell is disposed in the boundary region only.

6. The transparent organic light-emitting display device of claim 5, further comprising an insulation layer pattern electrically insulating adjacent solar cells,
    wherein the insulation layer pattern entirely overlaps the display structure in the pixel region.

7. The transparent organic light-emitting display device of claim 3, wherein the solar cell is disposed at a portion of the pixel region and at a portion of the boundary region.

8. The transparent organic light-emitting display device of claim 7, further comprising an insulation layer pattern electrically insulating adjacent solar cells,
    wherein the insulation layer pattern partially overlaps the display structure in the pixel region.

9. The transparent organic light-emitting display device of claim 1, wherein the solar cell is configured to convert at least one of an incident light from outside the transparent organic light-emitting display device and light emitted from the display structure, into electric energy.

10. The transparent organic light-emitting display device of claim 9, wherein the electric energy generated by the solar cell is configured to be used as a power source for the display structure of the transparent organic light-emitting display device.

11. A transparent organic light-emitting display device, comprising:
    a lower transparent substrate comprising a pixel region and a boundary region disposed between adjacent pixel regions;
    a display structure disposed on the lower transparent substrate;
    a solar cell disposed on the lower transparent substrate;
    an encapsulation layer enclosing the display device;
    an additional overcoat layer disposed on the encapsulation layer;
    touch patterns disposed on the additional overcoat layer;
    a polarization member disposed on the touch patterns;
    an upper transparent substrate disposed on the polarization member; and
    an overcoat layer disposed between the display structure and the solar cell,
    wherein the overcoat layer electrically insulates the solar cell from the display structure.

12. A method of manufacturing a transparent organic light-emitting display device, the method comprising:
    providing a lower transparent substrate comprising a pixel region and a boundary region disposed between adjacent pixel regions;
    disposing a solar cell on the lower transparent substrate;
    disposing a display structure on the lower transparent substrate;
    disposing an encapsulation layer to enclose the display structure;
    disposing an additional overcoat layer on the encapsulation layer;
    disposing touch patterns on the additional overcoat layer;
    disposing a polarization member on the touch patterns;
    disposing an upper transparent substrate on the polarization member; and
    disposing an overcoat layer between the solar cell and the display structure,
    wherein the overcoat layer electrically insulates the display structure from the solar cell.

13. The method of claim 12, wherein:
    disposing the overcoat layer comprises depositing a silicon nitride comprising hydrogen by a low temperature chemical vapor deposition process; and
    the hydrogen content in the overcoat layer varies according to a ratio between silane ($SiH_4$) and ammonia ($NH_3$).

14. The method of claim 12, wherein disposing the solar cell comprises disposing the solar cell in both the pixel region and the boundary region.

15. The method of claim 12, wherein:
    disposing the solar cell comprises:
        disposing the solar cell on the boundary region; and
        disposing an insulation layer pattern on the boundary region;
    the insulation layer pattern entirely overlaps the display structure in the pixel region; and
    the insulation layer pattern electrically insulates adjacent solar cells.

16. The method of claim 12, wherein:
    disposing the solar cell comprises:
        disposing the solar cell at a portion of the pixel region and at a portion of the boundary region; and disposing an insulation layer pattern to partially overlap the display structure in the pixel region; and the insulation layer pattern electrically insulates adjacent solar cells.

17. A method of manufacturing a transparent organic light-emitting display device, the method comprising:

providing a lower transparent substrate comprising a pixel region and a boundary region disposed between adjacent pixel regions;

disposing a display structure on the lower transparent substrate;

disposing a solar cell on the lower transparent substrate, the solar cell comprising:

a lower electrode;

a first semiconductor pattern disposed on the lower electrode, the first semiconductor pattern comprising an n-type semiconductor;

a second semiconductor pattern disposed on the first semiconductor pattern, the second semiconductor pattern comprising a p-type semiconductor;

an upper electrode disposed on the second semiconductor pattern; and an anti-reflective layer disposed on the upper electrode, the anti-reflective layer comprising a transparent conductive material; and disposing an overcoat layer between the display structure and the solar cell, wherein the overcoat layer electrically insulates the solar cell from the display structure.

* * * * *